Figures 1, 2:
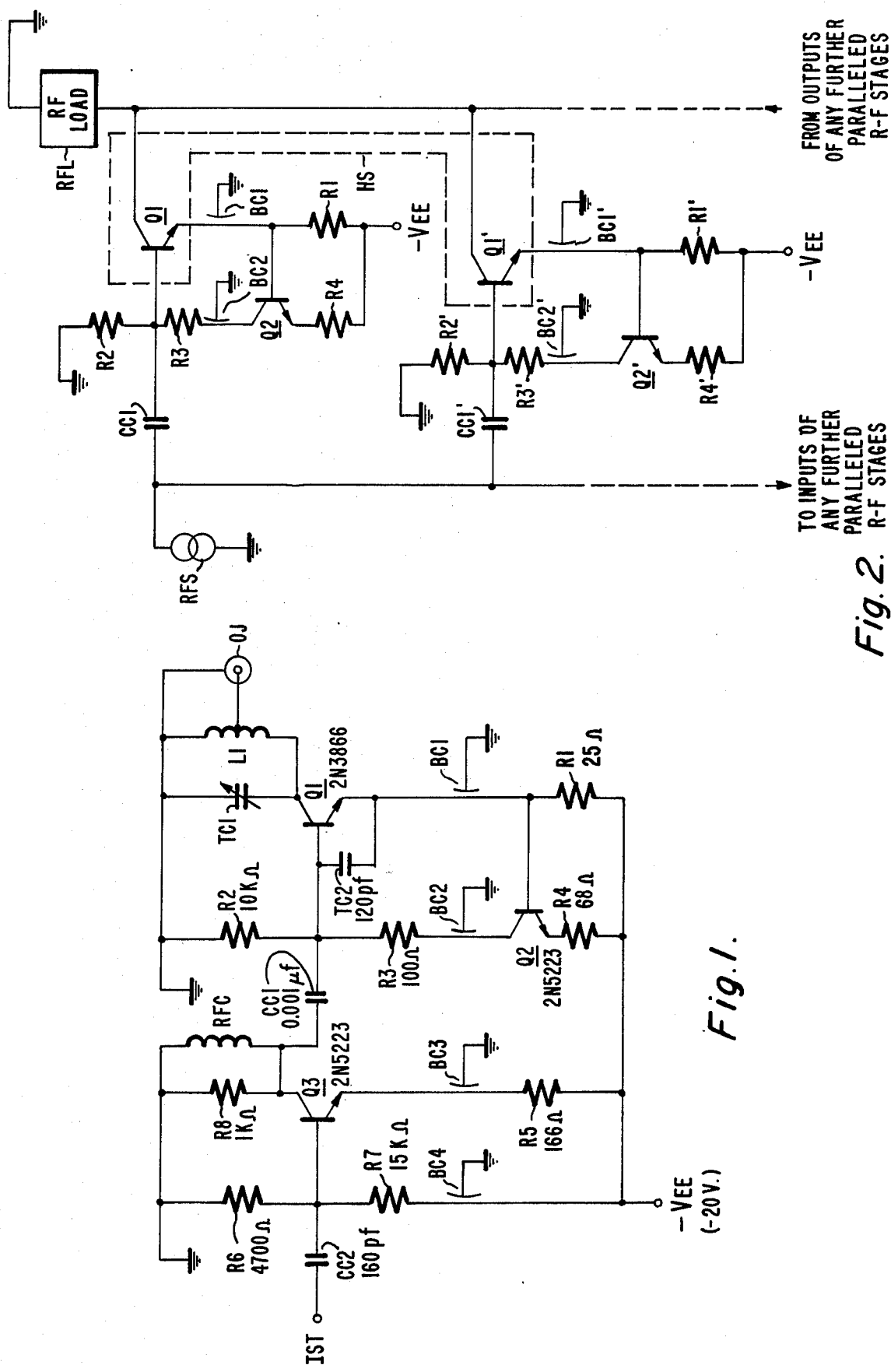

United States Patent [19]

Anderson

[11] 4,105,944

[45] Aug. 8, 1978

[54] QUIESCENT BIASING OF R-F POWER TRANSISTORS FOR OTHER THAN CLASS A OPERATION

[75] Inventor: Wendell Goundrey Anderson, Moorestown, N.J.

[73] Assignee: RCA Corporation, New York, N.Y.

[21] Appl. No.: 853,586

[22] Filed: Nov. 21, 1977

[51] Int. Cl.$^2$ ............................................. H03F 3/19
[52] U.S. Cl. ................................. 330/290; 330/295; 330/296; 330/306
[58] Field of Search ............... 330/290, 295, 296, 302, 330/306

[56] References Cited

U.S. PATENT DOCUMENTS

| | | | |
|---|---|---|---|
| 3,327,238 | 6/1967 | Harwood | 330/306 X |
| 3,984,783 | 10/1976 | Bickley | 330/296 |

*Primary Examiner*—James B. Mullins
*Attorney, Agent, or Firm*—H. Christoffersen; A. L. Limberg

[57] ABSTRACT

Current feedback is used to adjust the quiescent emitter current of an r-f amplifier transistor to prescribed idling or stand-by value, to avoid undesirable quiescent base-input-impedance conditions, but is disabled upon application of r-f drive to the base electrode of the r-f transistor so that operation which is other than Class A is not interfered with.

8 Claims, 2 Drawing Figures

QUIESCENT BIASING OF R-F POWER TRANSISTORS FOR OTHER THAN CLASS A OPERATION

The present invention relates to the biasing of transistors in r-f amplifiers, particularly high power r-f amplifiers such as found in the later stages of an r-f broadcast transmitter, which transistors are driven with signals such that they are conductive only at particular times—that is, where the transistors are not operated in Class A but rather are operated for example in Class AB, Class B or Class C.

A transistor used in an r-f amplifier stage or a frequency-multiplier stage such as a double or tripler is conventionally arranged in common-emitter configuration, with a tuned input network connected to apply input drive signal to its base electrode and with a tuned output network connected to extract output signal from its collector electrode. A phenomenon encountered in such an arrangement when operating other than Class A is that the input admitance, including susceptance as well as conductance components, changes appreciably depending upon the degree to which the transistor is conductive.

This phenomenon gives rise to problems with the design of the tuned input network. For example, it is often desired to tune out the effects of the base lead inductance of the common-emitter r-f transistor by including in the tuned input network, capacitance from base electrode to r-f ground. This presents no problem so long as the r-f transistor is continuously driven by r-f signal. But once the transistor becomes non-conductive, the inductance that antiresonates this capacitance substantially disappears. So the capacitance short-circuits drive signal and prevents its application to the base-emitter junction of the common-emitter emitter r-f transistor, undesirably resulting in the r-f transistor being latched into an out-of-conduction condition.

When the base-emitter junctions of a plurality of r-f transistors are in parallel connection with each other to receive input signal current, dependence of the base-electrode input admittances of these r-f transistors upon their respective degrees of conduction contributes to the often-dealt-with problem of the input signal current not being properly apportioned as base currents to the transistors.

The foregoing problems and other problems with transistors operated other than in Class A, which have their inception in the dependence of base-electrode input admittance upon the degree of transistor conduction, can be mitigated or obviated by arranging for an idling current to flow through the collector-to-emitter path of the r-f transistor under no-input-signal conditions. Desire to avoid compromise in r-f stage efficiency—that is, maximum r-f power out of the stage versus d-c power consumed by the stage—dictates that the idling current be kept to a prescribed relatively low value and that the base-bias network used to maintain this idling current consume relatively little power. These desiderata can be met by regulating the flow of idling current using a current feedback method, more particularly by regulation of r-f transistor quiescent emitter current using a current feedback method.

The commonplace method for regulating the quiescent emitter current flow of a transistor by current feedback is simply to use an emitter-degeneration resistor. However, so large a resistance emitter-degeneration resistor must be used to get sufficient stabilization of emitter current to avoid thermal runaway, that the IR loss in the emitter-degeneration resistor appreciably reduces r-f stage efficiency. The power to sustain this IR loss is unacceptably costly in high-power r-f amplifier stages such as the later stages in an r-f broadcast transmitter. The present inventor observed that to reduce this IR loss and improve r-f stage efficiency, since one cannot reduce emitter current and sustain output power requirements, one must reduce the resistance of the emitter degeneration resistor to get acceptably high r-f stage efficiency.

L. J. Giacoletto in U.S. Pat. No. 2,816,964 issued Dec. 17, 1957 and entitled "Stabilizing Means for Semi-Conductor Circuits" describes a solution for reducing the resistance of emitter-degeneration resistances required to achieve high degrees of quiescent emitter current stabilization in Class A transistor amplifiers. Giacoletto applies the quiescent potential drop across a relatively low-resistance emitter-degeneration resistor to the base electrode of an auxiliary transistor of the same conductivity type as the Class A signal amplifier transistor. The auxiliary transistor is arranged as a common-emitter amplifier to amplify the variations in this quiescent potential drop at its collector electrode by a factor −G, G being a positive number, so they are of a sense suitable for application to the base electrode of the Class A amplifier. The Class A signal amplifier transistor is subjected to the same current feedback corrections in the Giacoletto arrangement as a Class A signal amplifier transistor would be in an arrangement without auxiliary transistor, but with an emitter degeneration resistance G+1 times that in the Giacoletto arrangement.

A circuit configuration as shown by Giacoletto does not operate satisfactorily when the input signal swing is increased so that the r-f transistor is conductive only over portions of each cycle. The present inventor finds this to be caused by the current feedback operating to degenerate the zero-frequency component of the non-Class-A emitter current of the r-f transistor, which component arises from the asymmetrical clipping of the r-f signal by the unilateral conduction of the transistor base-emitter junction. Accordingly, a direct current component appears in the collector current of the auxiliary transistor, which tends to reduce the conduction of the r-f transistor to just the tips of the r-f signal, so that the conduction angle of the r-f transistor is narrowed. This means that to get a specified r-f power out of the r-f stage, a much larger input signal voltage swing would undesirably be required of the previous r-f stage. The zero-frequency component of the non-Class-A signal current flowing through the r-f transistor emitter electrode due to asymmetrical clipping in its base-emitter junction cannot be separated from the quiescent direct current flow through the r-f transistor emitter electrode, using linear circuit techniques. I.e., one cannot separate them from each other by frequency-selective filtering using reactive components or using reactive and resistive components in combination. So ordinary circuit analysis tends to contraindicate the Giacoletto arrangement for operation of the r-f transistor other than in Class A.

In the present invention, Giacoletto's method is used only when the r-f amplifier transistor is not driven with r-f signal, with the current feedback loop being disabled upon application of r-f drive. To this end, resistance is inserted between the base electrode of the r-f amplifier transistor and the collector electrode of the auxiliary transistor, by-passed for r-f, so the auxiliary transistor saturates in response to asymmetrically clipped r-f signal component in the emitter current of the r-f amplifier transistor.

In the drawing:

FIG. 1 is a schematic diagram of a frequency tripler embodying the present invention, and the preceding r-f stage; and FIG. 2 is a schematic diagram of a plurality of parallelled r-f transistors which are arranged in accordance with the present invention to avoid current-hogging problems.

In FIG. 1 r-f amplifier transistor Q1 is connected in common-emitter amplifier configuration for r-f, with its emitter electrode bypassed to ground for r-f by bypass-capacitance BC1. Q1 is provided with a tuned collector load, a tank circuit comprising capacitor TC1 and inductor L1, tuned to 90 MHz, the third harmonic of the 30 MHz carrier of the signal applied to the base electrode of Q1. L1 is tapped to supply tripled r-f to output jack OJ. The base lead inductance of Q1 is anti-resonated by capacitor TC2 connecting the base electrode of Q1 to its emitter electrode, as shown, or alternately directly to r-f ground. R1 connects the emitter electrode of Q1 to negative operating voltage $-V_{EE}$ (e.g., $-20V$) and provides emitter degeneration resistance to Q1 for direct current. In accordance with Ohm's Law, a direct potential proportional to the direct component of the emitter current of Q1 appears across R1, which direct potential is applied to the base electrode of a transistor Q1 of similar conductivity type to Q2.

This direct potential controls the conduction of Q2, used to provide shunt regulation of the current applied to the base of Q1 under quiescent conditions, as taught by Giacoletto.

Forward-bias current for the base-emitter junction of Q1 is available through resistor R2 connecting ground to the base of Q1, which forward bias current might otherwise be furnished from the collector electrode of a transistor selected to be of complementary conductivity type to that of Q1 and arranged for operation as a constant current generator. Under quiescent conditions a portion of the current otherwise available as forward-bias current for the base-emitter junction of Q1 is diverted by the shunt regulator action of transistor Q2 to the path through resistor R3, the collector-to-emitter path of Q2, and resistor R4. The shunt regulator action of Q2 holds the quiescent emitter current $I_{EQ1}$ of Q1 flowing through R1 to a value equal to the quantity the emitter-to-base offset potential $V_{BEQ2}$ of Q2 plus the small potential drop across R4, all divided by the resistance of R1.

If $I_{EQ1}$ increases, the potential drop across R1 increases, biasing Q2 into increased conduction. The increased quiescent collector current $I_{CQ2}$ of Q2 is supplied via R3 and R2, increasing the potential drop across R2 and thus reducing the forward-bias potential applied to the base electrode of Q1 and consequently the quiescent emitter current of Q1. (Where R2 is replaced by a constant current generator, increased $I_{CQ2}$ diverts available forward-bias base current from Q1, securing the same end results.)

Conversely, if $I_{EQ1}$ decreases, the potential drop across R1 decreases; and Q2 is not biased quite so far into conduction. The resulting lessened $I_{CQ2}$ demand leads to a decrease in the potential drop across R2, applying less negative base potential to Q1 thereby to increase its conduction and the value of $I_{EQ1}$. (Where R2 is replaced by a constant current generator, lessened $I_{CQ2}$ demand permits more of the constant current to flow as forward-bias base current to Q1, increasing $I_{EQ1}$.)

The resistance of R3 is chosen just large enough, as compared to the input impedance of Q1 when conductive, that r-f stage efficiency is not adversely affected, to forestall self-oscillation in the current feedback loop. R4 is used as an emitter degeneration resistor for Q2, also to reduce the likelihood of self-oscillation in the current feedback loop.

R-f drive is coupled via coupling capacitor CC1 to the base electrode of Q1 from the collector electrode of a common-emitter transistor Q3 whenever input signal r-f is applied to an input signal terminal IST to couple signal, via coupling capacitor CC2, to the base electrode of Q3. By-pass capacitance BC2 prevents the r-f drive forward-biasing the collector-base junction of Q2. The base-emitter circuit of Q3 includes an emitter degeneration resistor R5 and is supplied bias for forward-biasing the base-emitter junction of Q3 by a resistive potential divider comprising resistors R6 and R7. The quiescent-collector potential of Q3 is at ground since the collector electrode of Q3 is connected by r-f choke RFC to d-c (as well as r-f) ground. RFC is parallelled by resistor R8 which determines the r-f collector load resistance of Q3. The emitter electrode of Q3 is by-passed for r-f by bypass capacitance BC3, and the end of R7 not connected to the base electrode of Q3 is by-passed to ground for r-f by bypass capacitance BC4. In short, the design of the first r-f stage in FIG. 1 is thoroughly conventional. (BC1, BC2, and BC3 and BC4 in the design shown each may include a 400 pf feed-through capacitor parallelled by an 0.1 μf disc ceramic capacitor.)

The more negative or less positive portions of the r-f drive applied to the base electrode of Q1 render Q1 non-conductive and would tend to reduce the average emitter current of Q1 from its small quiescent value $I_{EQ1}$. This tendency is overwhelmed by the more positive portions of the r-f drive increasing the average emitter current of Q1 considerably above its quiescent $I_{EQ1}$ value. The higher average emitter current of Q1 causes a correspondingly larger direct potential drop across its bypassed emitter degeneration resistor R1. This larger drop applied to the base-emitter circuit of Q2 can, owing to the presence of R3, bias Q2 into saturation, thus disabling the current feedback so it is inoperative for the more positive swings of r-f drive signal. R3 permits the base potential of Q1 to swing positive respective to the collector potential of Q2 when in saturation, so there is no substantial restraint upon the r-f drive signal to the base of Q1 during any portion of its cycle, as would shift its average-value axis.

FIG. 2 shows a plurality of common-emitter transistors Q1, Q1' . . . preferably arranged on a common heat sink HS. Q1, Q1' . . . are parallelled, having the r-f drive from a source RFS of r-f apportioned between or amongst their respective base-emitter circuits by means of coupling capacitors CC1, CC1' . . . , and having their respective collector-emitter circuits arranged in parallel to supply a shared r-f load RFL. The components with primed identification associated with Q1' correspond to the components with similar, except unprimed, identification associated with Q1. Any further transistors besides Q1, Q1' in the plurality are connected similarly to them.

Parallelling r-f transistors normally presents the problem that when they are initially provided r-f drive after not receiving r-f drive for a time, certain of the transistors tend to conduct at lower drive level than others. The base input impedance of these certain transistors falls, diverting r-f drive from any as yet non-conductive transistor. Each transistor that is in conduction will continue to hog more than its appropriate share of the r-f drive current and will deliver more r-f than its appropriate share. This frustrates attaining the goal striven for when one parallells r-f transistors— namely, to divide up the supply of power to the shared load so the portion of the total power required by the load which must be supplied by each of the transistors is within its maximum power ratings. The transistors that hog r-f drive current over-dissipate and suffer destruction or permanent injury.

The parallelled r-f transistors Q1, Q1' . . . have their respective quiescent emitter currents $I_{EQ1}$, $I_{EQ1'}$ . . . adjusted to be substantially equal by the shunt regulator connections of Q2, Q2' . . . . . The current feedback scheme discussed in connection with FIG. 1 adjusts the emitter current of Q1 or any replacement transistor of the same semiconductive material to substantially the same value without respect to normal variations in transistor operating characteristics, the emitter-to-base potential of Q2 or any replacement transistor of the same semiconductive material being substantially the same. So replication of the FIG. 1 circuit with each replica using like transistors and similar-valued corresponding resistors will result in each of the transistors Q1, Q1' . . . having respective quiescent emitter currents $I_{EG1}$, $I_{EQ1'}$ . . . of substantially equal value.

With equal quiescent emitter currents in the parallelled transistors Q1, Q1' . . . , their base input impedances will tend to be in proportion to their common-emitter forward current gains ($h_{fe}$'s). So input r-f drive will tend to be apportioned between the parallelled base-emitter circuits so that low-$h_{fe}$ transistors receive a greater portion of r-f drive current than high-$h_{fe}$ transistors. This desirably tends to apportion the r-f power to be supplied by the plurality of parallelled transistors Q1, Q1' . . . equally between or amongst them.

Not only do the parallelled transistors Q1, Q1' . . . have their respective quiescent base potentials adjusted vis-a-vis each other so that their initial conduction tends to be simultaneous, but also so their conduction at higher drive levels tends to be substantially equal. As the r-f drive voltage increases, each 18 millivolt increment doubles the collector current of each transistor owing to the exponential transfer characteristic to which the transistors each adhere. So the apportionment of power delivered to the load between or amongst transistors Q1, Q1' . . . continues in predetermined proportion.

Connection as shown in FIG. 2 solves the current-hogging problem of parallelled r-f transistors. As further safeguard against current-hogging one may include equal-valued impedances in each of the connections of r-f source RFS and the base electrodes of Q1, Q1' . . . in accordance with conventional practice, the present invention permitting one to reduce the value of these impedances as compared to safe conventional practice if he so desire.

The r-f circuit designer of ordinary skill in the art, armed with teaching of the present disclosure, will be able to develop other r-f circuitry embodying the invention claimed hereinafter and the scope of the following claims should be construed accordingly.

What is claimed is:

1. In an r-f amplifier including at least one common-emitter r-f amplifier transistor, each said r-f amplifier transistor in addition to having an emitter electrode having a base electrode connected for receiving at least a portion of an r-f drive signal, the supply of which is susceptible to interruption, and having a collector electrode for connection to a load, the improvement for avoiding undesirable quiescent base-input impedance conditions in each r-f amplifier transistor comprising:

respective current feedback means connected to each r-f amplifier transistor for regulating its emitter current to a prescribed value during interruption of r-f drive signal, each current feedback means including a respective emitter degeneration resistance for its r-f amplifier transistor, a respective auxiliary transistor being of the same conductivity type as its r-f amplifier transistor and having base and emitter and collector electrodes and having emitter-base and collector-base junctions, respective means for applying the quiescent potential drop across its emitter degeneration resistance to a respective circuit including the emitter-base junction of its auxiliary transistor, and means for connecting the collector electrode of its auxiliary transistor to the base electrode of its r-f amplifier transistor; and means responsive to r-f signal being supplied for disabling said respective current feedback means.

2. An improved r-f amplifier as set forth in claim 1 wherein said means responsive to r-f drive signal being supplied for disabling said respective current feedback means is provided by each said respective current feedback means including a respective further resistor in its means for connecting the collector electrode of its auxiliary transistor to the base electrode of its r-f amplifier transistor, whereby that auxiliary transistor will be operated in saturation whenever said r-f drive signal is supplied, but out of saturation whenever the supply of said r-f drive signal is interrupted, and wherein means are provided for bypassing r-f drive signal from the collector-base junction of each auxiliary transistor.

3. An improved r-f amplifier as set forth in claim 2 wherein each said r-f amplifier transistor has a capacitor-connected to tune out its base input inductance.

4. An improved r-f amplifier as set forth in claim 2 wherein a plurality of common emitter r-f transistors is included, their respective current feedback means and means for disabling said respective current feedback means being of similar design, thereby to eliminate hogging of r-f drive signal current.

5. An improved r-f amplifier as set forth in claim 1 wherein each said r-f amplifier transistor has a capacitor connected to tune out its base input inductance.

6. An improved r-f amplifier as set forth in claim 1 wherein a plurality of common emitter r-f transistors is included, their respective current feedback means and means for disabling said respective current feedback means being of similar design, thereby to eliminate hogging of r-f drive signal current.

7. An r-f amplifier including:
means for applying an r-f drive signal to an r-f drive signal terminal, which application is susceptible of interruption;

a plurality, N, in number, of common-emitter r-f amplifier transistors having in addition to their respective emitter electrodes, respective collector electrodes connected to a shared load and respective base electrodes at which respective r-f impedances are exhibited;

means for connecting said r-f drive signal terminal to the base electrodes of said r-f amplifier transistors, which means comprises a plurality, N, in number, of coupling capacitances being connected at their respective first ends to said r-f drive signal terminal and at their respective second ends to separate ones of the respective base electrodes of said r-f amplifier transistors, each coupling capacitance exhibiting relatively low r-f impedance compared to the r-f impedance exhibited at the base electrode to which it connects; and means for preventing the hogging of r-f signal drive current by certain of said r-f amplifier transistors comprising respective current feedback means connected to each r-f amplifier transistor for regulating its emitter current to a prescribed value during interruption of r-f drive signal, and means responsive to r-f signal being supplied for disabling said respective current feedback means.

8. An improved r-f amplifier as set forth in claim 7 wherein said respective current feedback means comprises:

a resistor in the collector-emitter current path of said r-f transistor for generating a voltage commensurate with the collector-emitter current, means applying said voltage to the base electrode of a further transistor whose collector electrode is connected to the base electrode of said r-f transistor for regulating currents therein.

* * * * *